(12) United States Patent
Wang

(10) Patent No.: US 7,145,771 B2
(45) Date of Patent: Dec. 5, 2006

(54) SYSTEM STRUCTURE AND FAN MODULE THEREOF

(75) Inventor: Ching-Wen Wang, Taipei Hsien (TW)

(73) Assignee: Wistron NeWeb Corp., Taipei Hsien (TW)

( * ) Notice: Subject to any disclaimer, the term of this patent is extended or adjusted under 35 U.S.C. 154(b) by 297 days.

(21) Appl. No.: 10/653,732

(22) Filed: Sep. 2, 2003

(65) Prior Publication Data

US 2004/0257767 A1    Dec. 23, 2004

(30) Foreign Application Priority Data

Jun. 17, 2003  (TW)  ................. 92210982 U

(51) Int. Cl.
*H05K 7/20* (2006.01)
(52) U.S. Cl. ............... 361/695; 165/80.3; 165/121; 454/184; 415/231.1
(58) Field of Classification Search ............... 165/80.3, 165/121–122; 361/687, 694–697, 715; 415/213.1, 415/214.1; 417/423.15, 423.14, 360; 454/184
See application file for complete search history.

(56) References Cited

U.S. PATENT DOCUMENTS

| | | | | |
|---|---|---|---|---|
| 4,517,880 A | * | 5/1985 | Buckner et al. | ............ 454/184 |
| 4,834,615 A | * | 5/1989 | Mauch et al. | ............ 415/213.1 |
| 5,208,730 A | * | 5/1993 | Tracy | ............ 361/687 |
| 5,788,566 A | * | 8/1998 | McAnally et al. | ........... 454/184 |
| 6,215,659 B1 | | 4/2001 | Chen | |
| 6,244,953 B1 | | 6/2001 | Dugan et al. | |
| 6,351,380 B1 | * | 2/2002 | Curlee et al. | ............... 361/695 |
| 6,375,440 B1 | | 4/2002 | Kosugi | |

FOREIGN PATENT DOCUMENTS

| | | | |
|---|---|---|---|
| JP | 3-135409 | * | 10/1991 |
| TW | 536127 | | 6/2003 |
| TW | 578995 | | 3/2004 |
| TW | M242763 | | 9/2004 |

* cited by examiner

*Primary Examiner*—Gregory Thompson
(74) *Attorney, Agent, or Firm*—Quintero Law Office

(57) ABSTRACT

A system structure with a fan module. The system structure has a housing and a fan module. The housing has a substrate with the fan module detachably installed thereon. The substrate has a plurality of guide ports, several first positioning portions and a second positioning portion. The fan module has a body, two plates and a fan unit. Each plate is detachably disposed on the body and provided with several positioning portions. When the fan module is attached to the substrate of the housing, the third positioning portions of the fan module are fixed by the first positioning portions of the substrate, and the fourth positioning portion of the fan module fits into the second positioning portion of the substrate.

10 Claims, 9 Drawing Sheets

SYSTEM STRUCTURE AND FAN MODULE THEREOF

BACKGROUND OF THE INVENTION

1. Field of the Invention

The present invention relates to a system structure, and in particular to a system structure provided with a fan module.

2. Description of the Related Art

For a PC or server host, a fan assembly is provided to dissipate heat generated. In general, the fan assembly is fixed on the inner wall of a housing by several screws. When the fan assembly is installed, several elements such as interface cards, memories, etc., must be removed first. Thus, it is time-consuming to assemble or disassemble the fan assembly to or from the host.

U.S. Pat. No. 6,215,659B1 discloses a fan assembly detachably engaged to a computer enclosure. Although the fan assembly is easily attached to or removed from the computer enclosure, several elements still must be removed to enable the process.

U.S. Pat. No. 6,375,440B2 discloses a fan unit disposed on a housing frame and a fan housing cover. The fan is supported by a fan case and disposed in a housing.

However, since the housing frame and the fan housing cover can only accommodate fans of a particular size, it is inconvenient to change fan sizes or configurations.

SUMMARY OF THE INVENTION

Accordingly, an object of the invention is to provide a system structure with a fan module providing more convenient removal and installation of fans, as well as accommodation of a variety of fan sizes and types.

The system structure of the invention has a housing and a fan module. The housing has a substrate with the fan module is detachably disposed thereon. The substrate is provided with a plurality of guide ports, several first positioning portions, and a second positioning portion. The fan module has a body, two plates and a fan unit. Each plate is detachably disposed on the body and provided with several positioning portions and a fourth positioning portion.

When the fan module is attached to the substrate of the housing, the third positioning portions of the fan module are fixed by the first positioning portions of the substrate, and the fourth positioning portion of the fan module fits into the second positioning portion of the substrate. Thus, the fan module is fixed on the system structure, and more convenient removal and installation of fans, as well as accommodation of a variety of fan sizes and types, is enabled.

A detailed description is given in the following embodiments with reference to the accompanying drawings.

BRIEF DESCRIPTION OF THE DRAWINGS

The present invention is more fully understood by reading the subsequent detailed description and examples with references made to the accompanying drawings, wherein.

DETAILED DESCRIPTION OF THE INVENTION

Figure 1A:
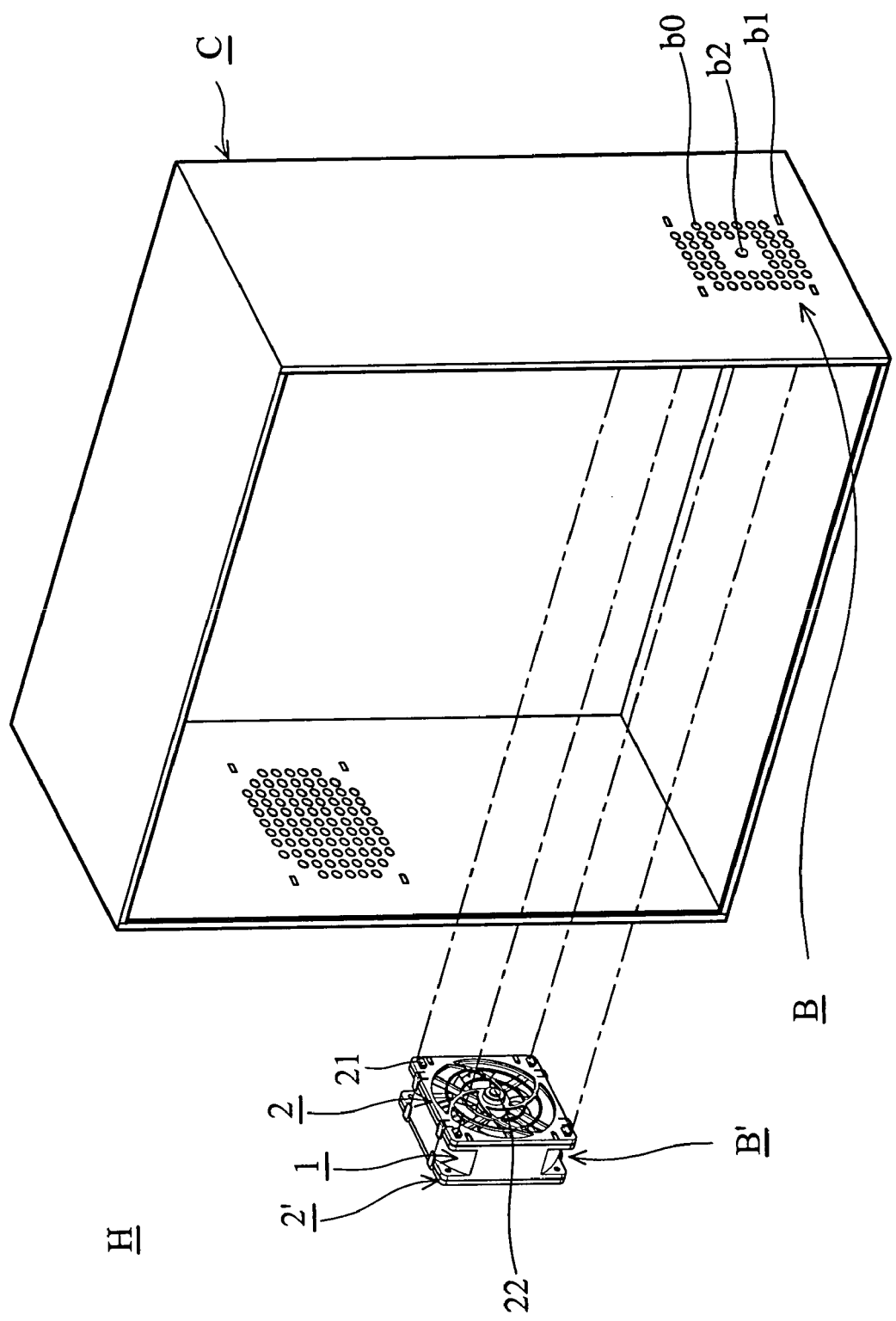
FIG. 1A is an exploded perspective view of a system structure (H) and a fan module (B') according to the invention.
Figure 1B:
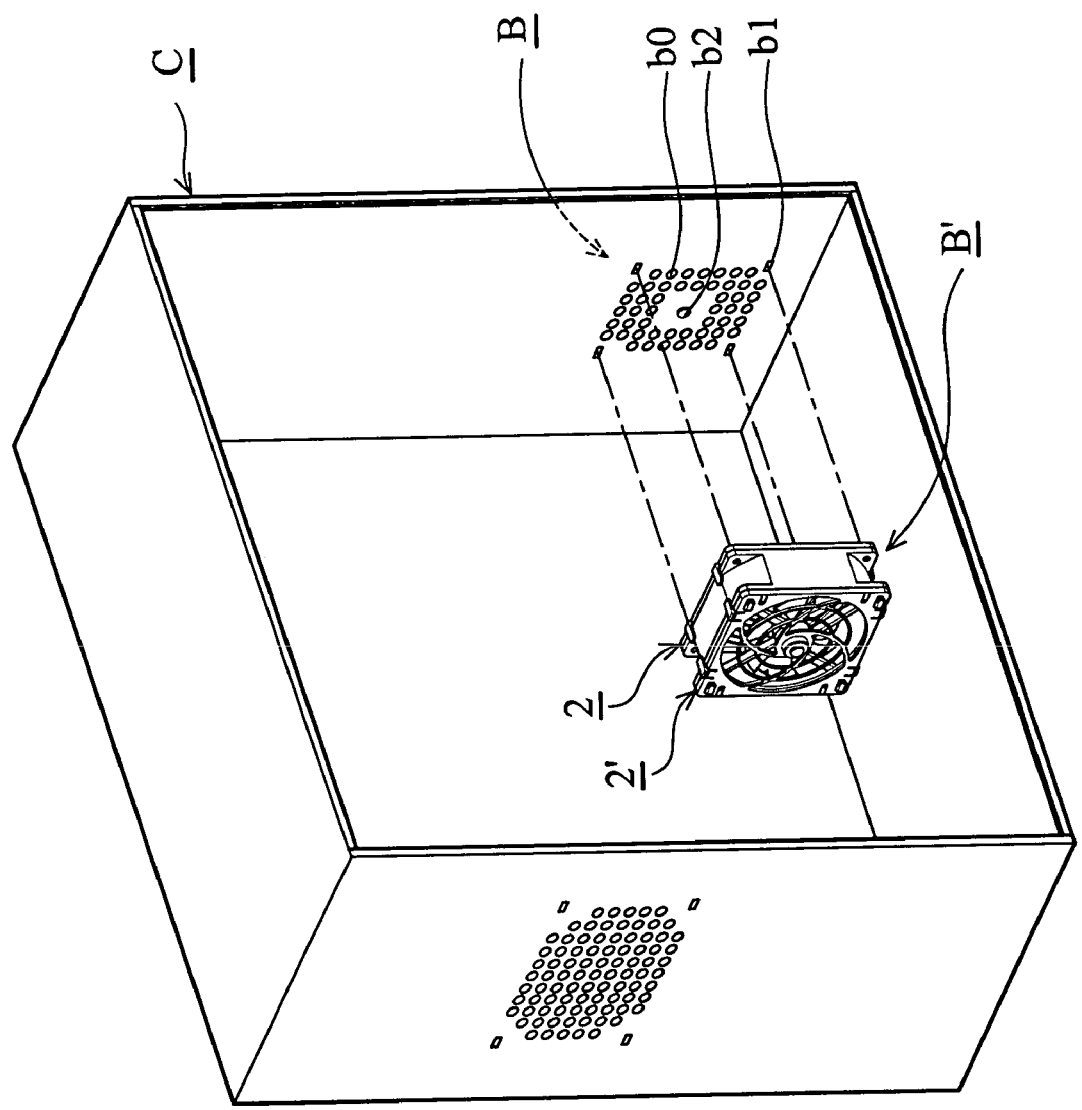
FIG. 1B is another exploded perspective view of the system structure (H) and the fan module (B') of FIG. 1A.

In FIGS. 1A and 1B, a system structure H of the invention has a housing C and a fan module B'. The housing C has a substrate B. The substrate B is a front plate of the housing C, and the fan module B' is detachably installed on the substrate B, for cooling and ventilation. The substrate B has a plurality of guide ports b0, four first positioning portions b1 and a second positioning portion b2. The guide ports b0, the first positioning portions b1 and the second positioning portion b2 are all through holes penetrating the substrate B. The first positioning portions b1 function as vents in a matrix on the substrate B, the four first positioning portions b1 are located at the periphery of the first positioning portions b1, and the second positioning portion b2 is located in the middle of the first positioning portions b1. The distances from each first positioning portion b1 to the second positioning portion b2 are the same. Each of the first positioning portions b1 is a trapezoidal opening.

Figure 2A:
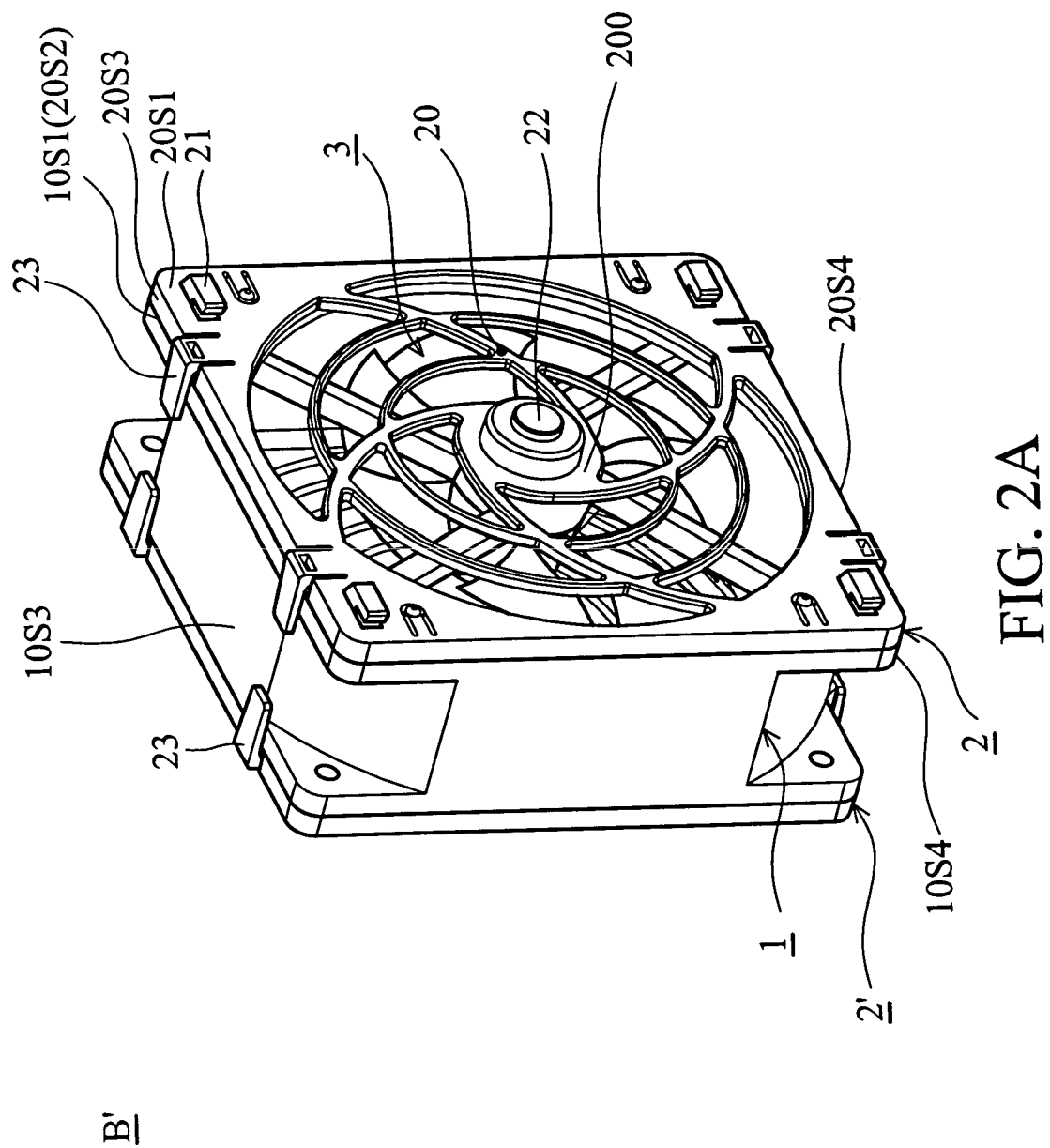
FIG. 2A is a perspective view of the fan module (B') of FIG. 1A.
Figure 2B:
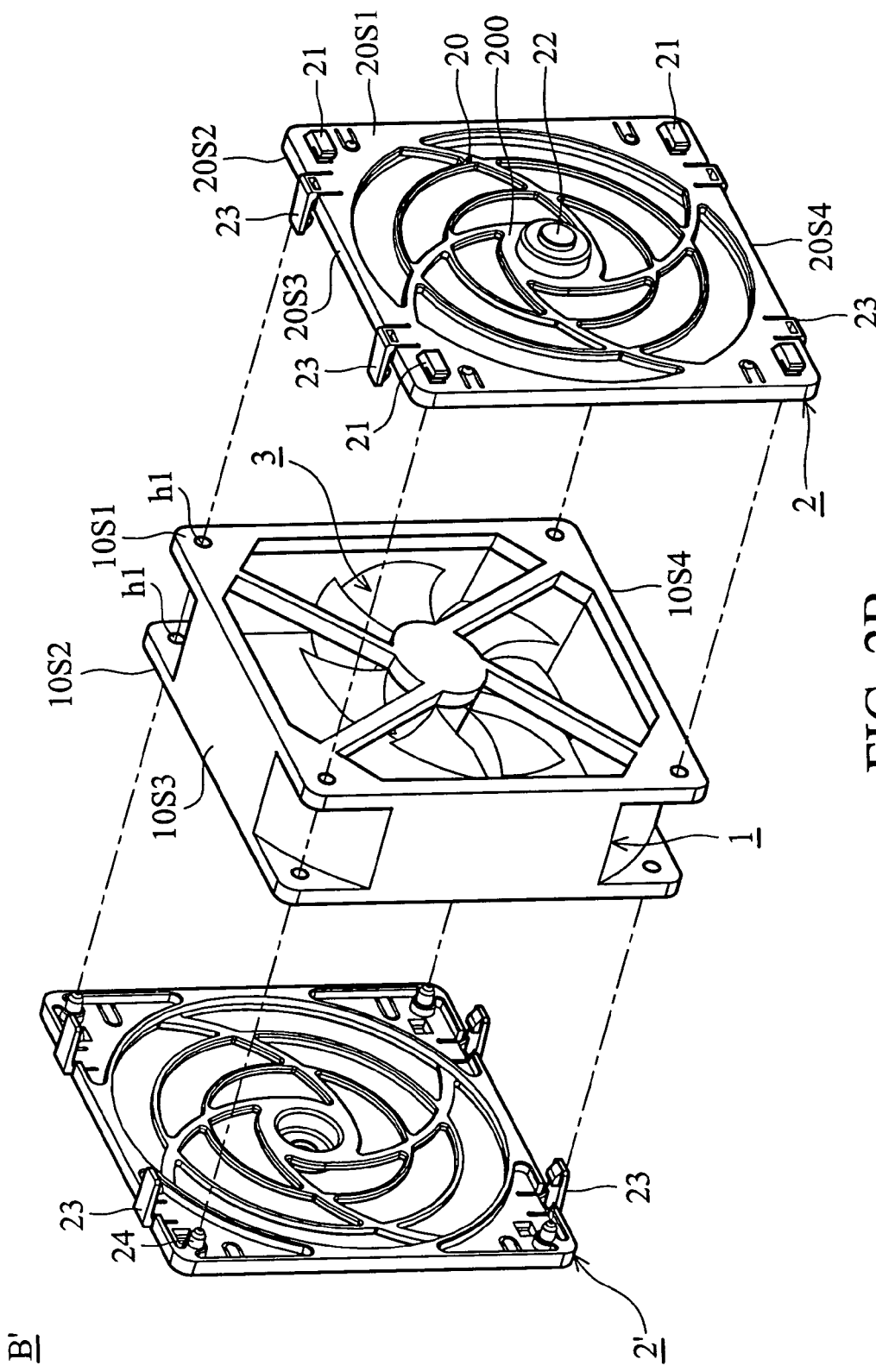
FIG. 2B is an exploded perspective view of the fan module (B') of FIG. 2A.

In FIGS. 2A and 2B, the fan module B' has a body 1, two plates 2, 2' and a fan unit 3. The body 1 has a hollow structure and the fan unit 3 is a revolvable element disposed thereon. Four positioning holes h1 are provided on the side surfaces 10S1, 10S2 of the body 1. The plates 2, 2' are detachably disposed on the side surfaces 10S1, 10S2 of the body 1, respectively, and each plate 2, 2' has the same structure.

For example, the plate 2 has a helical resilient portion 20, four third positioning portions 21, a fourth positioning portion 22, four L-shaped hooks 23, four cylindrical posts 24 are provided and integrally formed. The resilient portion 20 is a grille formed in the middle of the plate 2 and provided with different sizes of holes penetrating the surfaces 20S1, 20S2. Four third positioning portions 21 are L-shaped hooks formed on the surface 20S1 and located corresponding to the four first positioning portions b1 of the substrate B respectively. The fourth positioning portion 22 is a cylindrical protrusion formed on the resilient portion 20 extending from a central surface 200 of the resilient portion 20. The position of the fourth positioning portion 22 corresponds to the second positioning portion b2 of the substrate B. Each pair of L-shaped hooks 23 extends from the surface 20S1 toward the surface 20S2 by passing the end surface 20S3. The four cylindrical posts 24 (referring to the plate 2') extend from the surface 20S2 in positions corresponding to the four positioning holes h1 of the body 1.

In FIG. 2A, the plates 2, 2' are fixed on the body 1 by attaching the L-shaped hooks 23 of the plate 2 and the L-shaped hooks 23 of the plate 2' to the end surfaces 10S3, 10S4 of the body 1.

Figure 3:
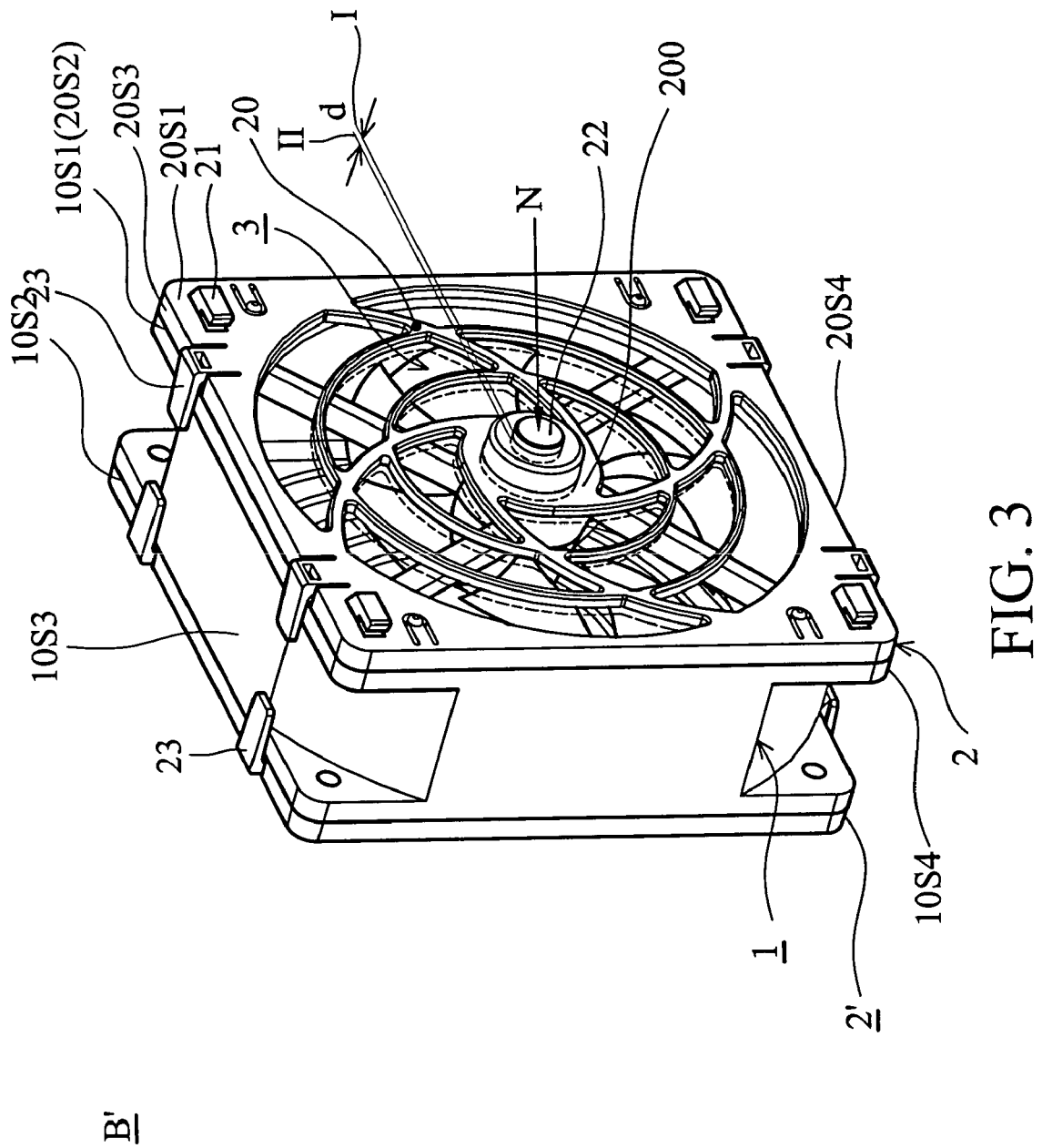
FIG. 3 is a perspective view of the fan module (B') subject to an external force (N)

In FIG. 3, external force N is applied to the fourth positioning portion 22 of the resilient portion 20 of the plate 2, such that the fourth positioning portion 22 moves from a first position I to a second position II through the flexibility of the deformed resilient portion 20 (dotted line), and a displacement "d" is formed from the first position I to a second position II. When force N is released, the fourth positioning portion 22 returns to the first position I from the second position II.

For better understanding of the relationship between the substrate B and the fan module B', the guide ports b0 of the substrate B in FIGS. 5A, 5B, 7A, and 7B are omitted.

Figure 4:
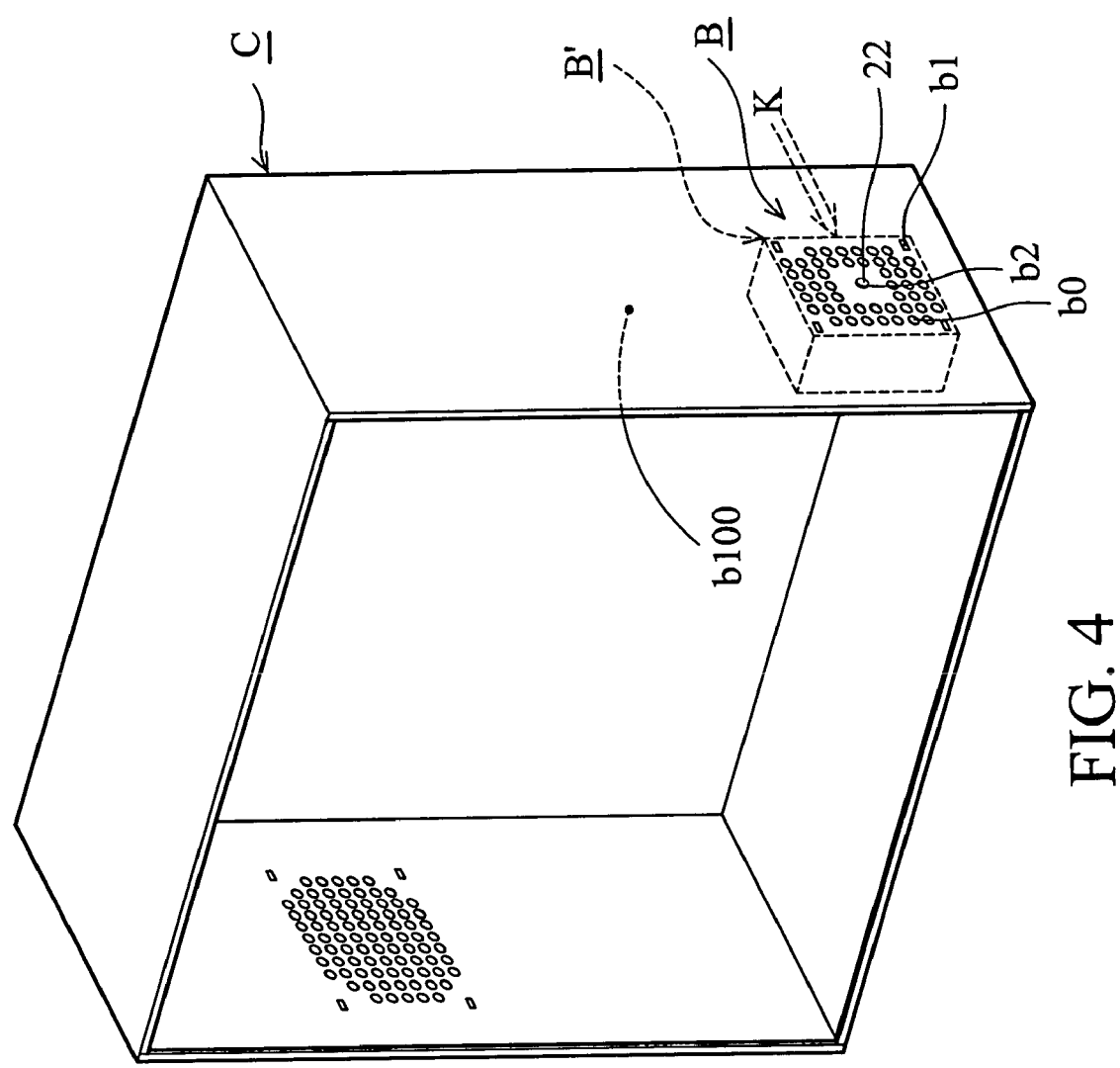
FIG. 4 is a perspective view of the system structure (H) and the fan module (B'), wherein the fan module (B') is about to be installed on the system structure (H) by an external force (K)
Figure 5B:
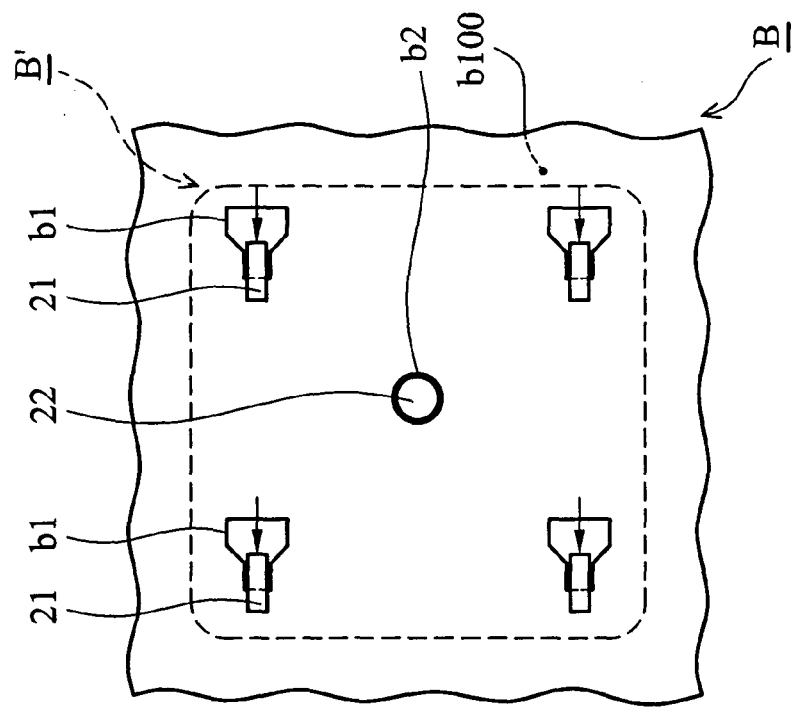
FIG. 5B is a partial plane view of a substrate (B) of the system structure (H) of FIG. 4, wherein the fan module (B') is installed on the substrate (B)
Figure 5A:
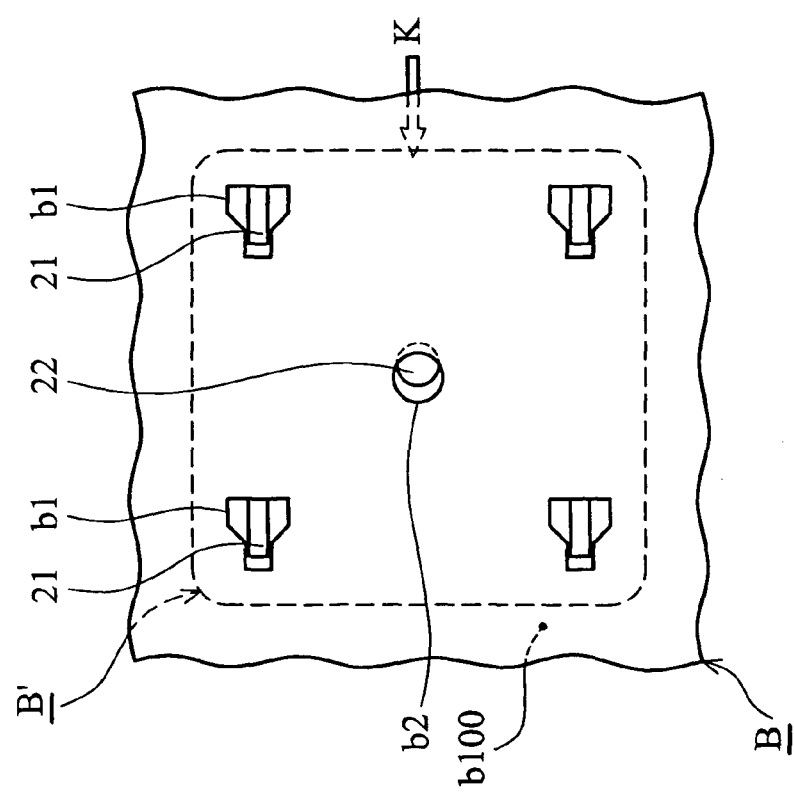
FIG. 5A is a partial plane view of a substrate (B) of the system structure (H) of FIG. 4, wherein the fan module (B') is about to be installed on the substrate (B) by the force (K)

In FIGS. 4 and 5A, the fan module B' is about to be installed on the substrate B of the housing C by an external force K. In FIG. 5A, the fan module B' is attached to the inner surface b100 of the substrate B and the four third positioning portions 21 of the fan module B' are inserted into the four first positioning portions b1 of the substrate B. An external force K is applied to the fan module B' to move the fan module B' in a direction corresponding to the force.

In FIG. 5B, the fourth positioning portion 22 of the fan module B' is then fit into the second positioning portion b2 of the substrate B, and all the L-shaped third positioning portions 21 of the fan module B' are fixed to the first positioning portions b1 of the substrate B.

Figure 6:
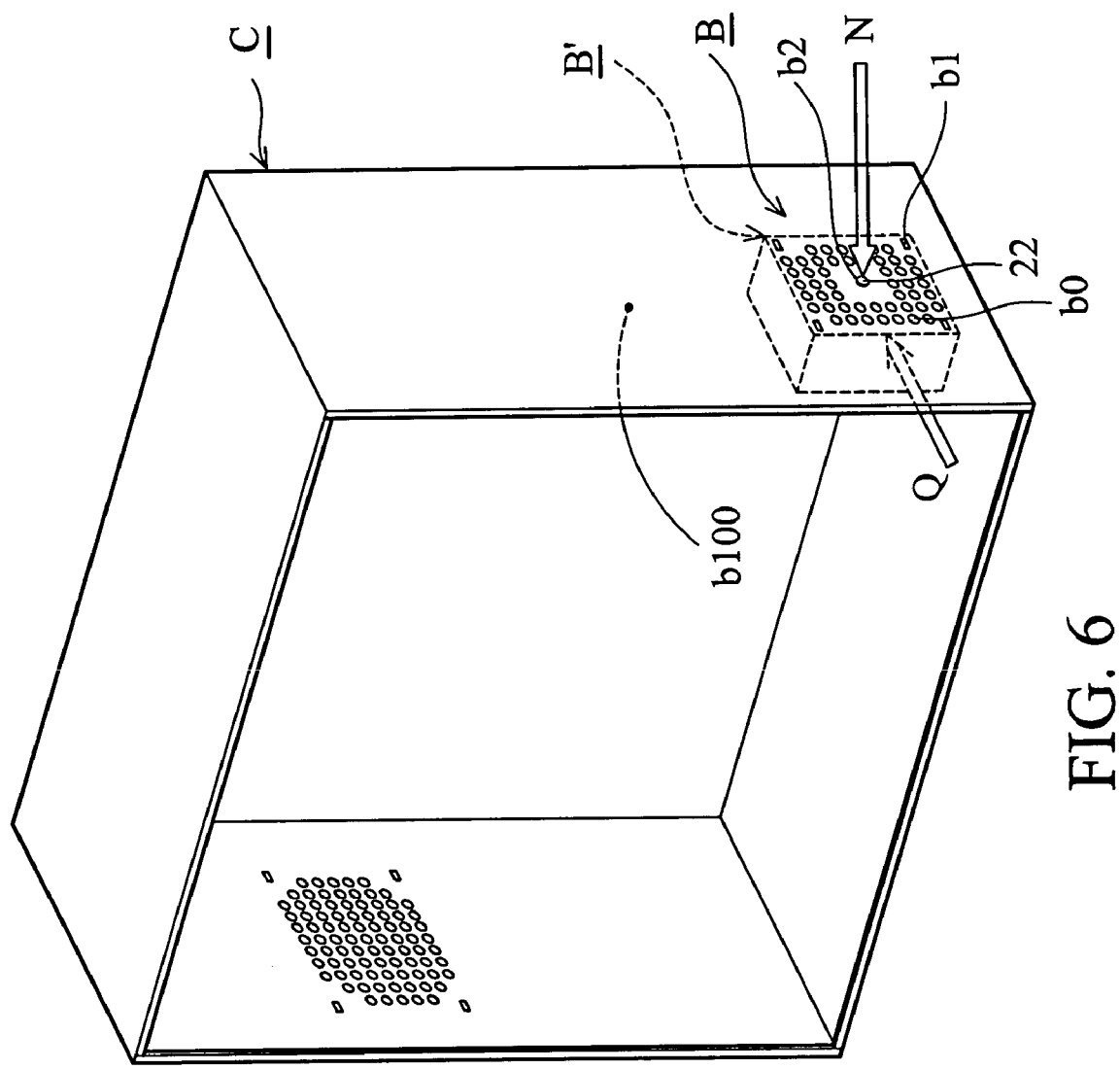
FIG. 6 is a perspective view of the system structure (H) and the fan module (B'), wherein the fan module (B') is about to be removed from the system structure (H) by two forces (N) and (Q)
Figure 7B:
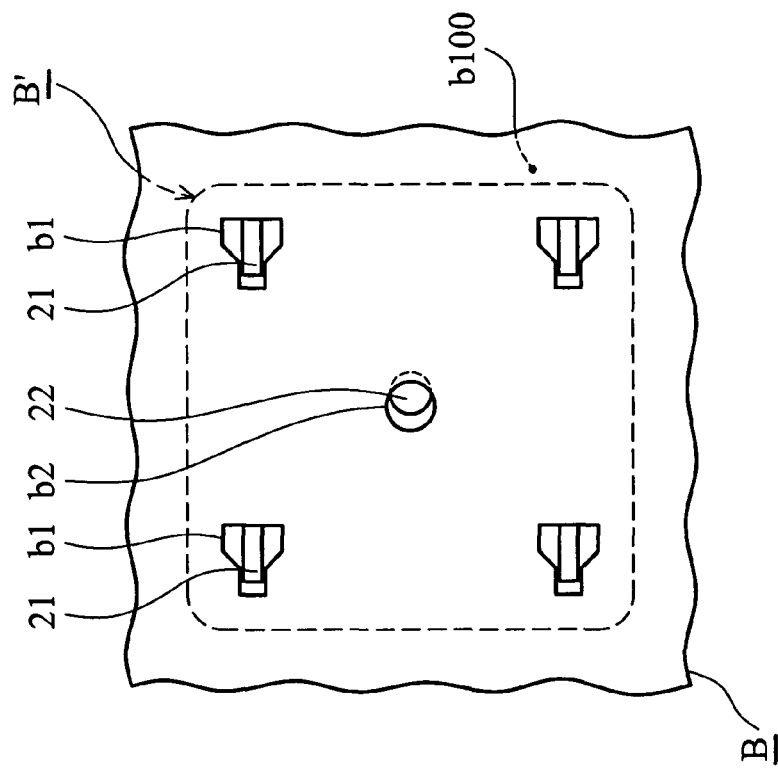
FIG. 7B is a partial plane view of a substrate (B) of the system structure (H) of FIG. 4, wherein the fan module (B') has been removed from the substrate (B).
Figure 7A:
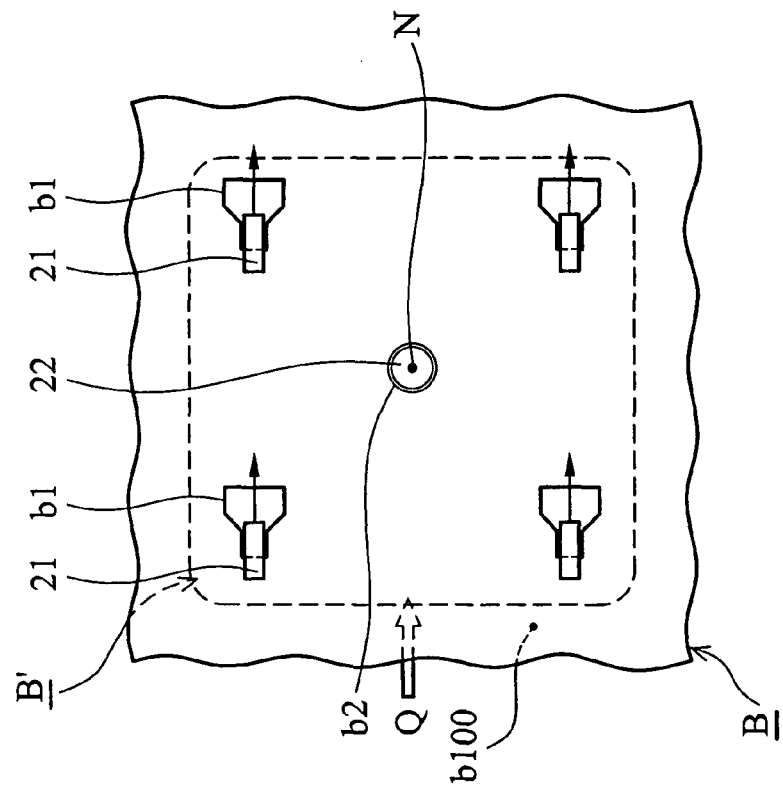
FIG. 7A is a partial plane view of the substrate (B) of the system structure (H) of FIG. 6, wherein the fan module (B') is about to be removed from the substrate (B) by the two forces (N) and (Q)

In FIGS. 6 and 7A, the fan module B' is about to be removed from the substrate B of the housing C by two forces N and Q. In FIG. 7A, the fan module B' is attached to the inner surface b100 of the substrate B, and the four third positioning portions 21 of the fan module B') are fixed on the four first positioning portions b1 of the substrate B, and the fourth positioning portion 22 of the fan module B' fits into the second positioning portion b2 of the substrate B. First, the force N is applied to the fourth positioning portion 22 of the fan module B', such that the positioning portion 22 of the fan module B' is pushed and moved from the first position I to the second position II (as shown in FIG. 3) and disengaged from the second positioning portion b2 of the substrate B. Then, the force Q is applied to the fan module B' to move the fan module B' in a direction corresponding to the force.

In FIG. 7B, the fourth positioning portion 22 of the fan module B' is disengaged from the second positioning portion b2 of the substrate B, and all the L-shaped third positioning portions 21 of the fan module B' are disengaged from the first positioning portions b1 of the substrate B.

It is noted that the fan unit 3 of the fan module B' disposed on the substrate B corresponds to the guide ports b0 of the substrate B. With the fan unit 3, cooling and ventilation are provided via the guide ports b0.

While the invention has been described in connection with what is presently considered to be the most practical and preferred embodiment, it is to be understood that the invention is not limited to the disclosed embodiments, but, on the contrary, is intended to accommodate various modifications and equivalent arrangements included within the spirit and scope of the appended claims.

What is claimed is:

1. A system structure, comprising:
    a housing having a guide port, a first positioning portion and a second positioning portion; and
    a fan module detachably disposed on the housing, having
        a body,
        a plate disposed on the body and provided with a resilient portion as a grille formed in the middle of the plate, a third positioning portion and a fourth positioning portion, the fourth positioning portion disposed on the middle of the resilient portion, and
        a fan unit disposed on the body corresponding to the guide port, wherein the third positioning portion is detachably engaged to the first positioning portion and the fourth positioning portion is detachably engaged with the second positioning portion.

2. The system structure as claimed in claim 1, wherein the third positioning portion and the fourth positioning portion are integrally formed on the plate.

3. The system structure as claimed in claim 1, wherein the third positioning portion is a hook.

4. The system structure as claimed in claim 1, wherein the fourth positioning portion is a protrusion.

5. The system structure as claimed in claim 1, wherein the second positioning portion is a through hole, and the fourth positioning portion is fully fitted in the through hole of the housing.

6. A fan module, comprising:
    a body;
    a fan unit disposed on the body; and
    a plate detachably disposed on the body, having a resilient portion as a grille with a protrusion formed on the middle of the plate, wherein the protrusion moves between a first position and a second position through the resilient portion when force is applied.

7. A fan module for disposing on a substrate provided with a guide port, a first positioning portion and a second positioning portion, comprising:
    a body;
    a plate detachably disposed on the body, having a resilient portion as a grille, a third positioning portion and a fourth positioning portion formed on the middle of the resilient portion, wherein the third positioning portion is detachably engaged to the first positioning portion and the fourth positioning portion is detachably engaged to the second positioning portion, wherein the third positioning portion and the fourth positioning portion are integrally formed on the plate.

8. The fan module as claimed in claim 7, wherein the third positioning portion is a hook.

9. The fan module as claimed in claim 7, wherein the fourth positioning portion is a protrusion.

10. The fan module as claimed in claim 7, wherein the second positioning portion is a through hole, and the fourth positioning portion is fully fitted in the through hole of the housing.

* * * * *

UNITED STATES PATENT AND TRADEMARK OFFICE
CERTIFICATE OF CORRECTION

| | | |
|---|---|---|
| PATENT NO. | : 7,145,771 B2 | |
| APPLICATION NO. | : 10/653732 | |
| DATED | : December 5, 2006 | |
| INVENTOR(S) | : Ching-Wen Wang | |

It is certified that error appears in the above-identified patent and that said Letters Patent is hereby corrected as shown below:

Title Page, Item (73) Assignee: should read

-- Wistron Corp.    Taipei Hsien (TW) --.

Signed and Sealed this

Twenty-ninth Day of May, 2007

JON W. DUDAS
*Director of the United States Patent and Trademark Office*